(12) United States Patent
Kim et al.

(10) Patent No.: US 8,675,436 B2
(45) Date of Patent: Mar. 18, 2014

(54) MULTI-CHANNEL SEMICONDUCTOR MEMORY DEVICE AND METHOD OF REFRESHING THE SAME

(75) Inventors: Ho-Young Kim, Incheon (KR); Woo-Pyo Jeong, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 922 days.

(21) Appl. No.: 12/825,935

(22) Filed: Jun. 29, 2010

(65) Prior Publication Data

US 2011/0007594 A1 Jan. 13, 2011

(30) Foreign Application Priority Data

Jul. 7, 2009 (KR) .......................... 10-2009-0061827

(51) Int. Cl.
*G11C 7/00* (2006.01)

(52) U.S. Cl.
USPC .......................................... 365/222; 711/106

(58) Field of Classification Search
USPC .......................................... 365/222; 711/106
See application file for complete search history.

(56) References Cited

U.S. PATENT DOCUMENTS

| 5,659,515 A * | 8/1997 | Matsuo et al. ................ 365/222 |
| 6,944,708 B2 * | 9/2005 | Frame et al. .................. 711/106 |
| 7,133,297 B2 * | 11/2006 | Yu et al. ........................ 361/803 |
| 2007/0070765 A1 | 3/2007 | Kim |

FOREIGN PATENT DOCUMENTS

| JP | 06-060643 | 3/1994 |
| JP | 2007-095277 | 4/2007 |
| KR | 100238236 | 10/1999 |
| KR | 1020070036646 | 4/2007 |

* cited by examiner

*Primary Examiner* — Harry W Byrne
*Assistant Examiner* — Lance Reidlinger
(74) *Attorney, Agent, or Firm* — F. Chau & Associates, LLC

(57) ABSTRACT

A multi-channel semiconductor memory device and a method of refreshing the same. In the multi-channel semiconductor memory device and method, a common refresh controller is prepared to detect refresh operation states of a plurality of sub-memory circuits (e.g. ICs) and to adjust refresh operation times of multiple sub-memory ICs so that two or more sub-memory ICs do not simultaneously perform a refresh operation, thereby reducing the peak current.

10 Claims, 4 Drawing Sheets

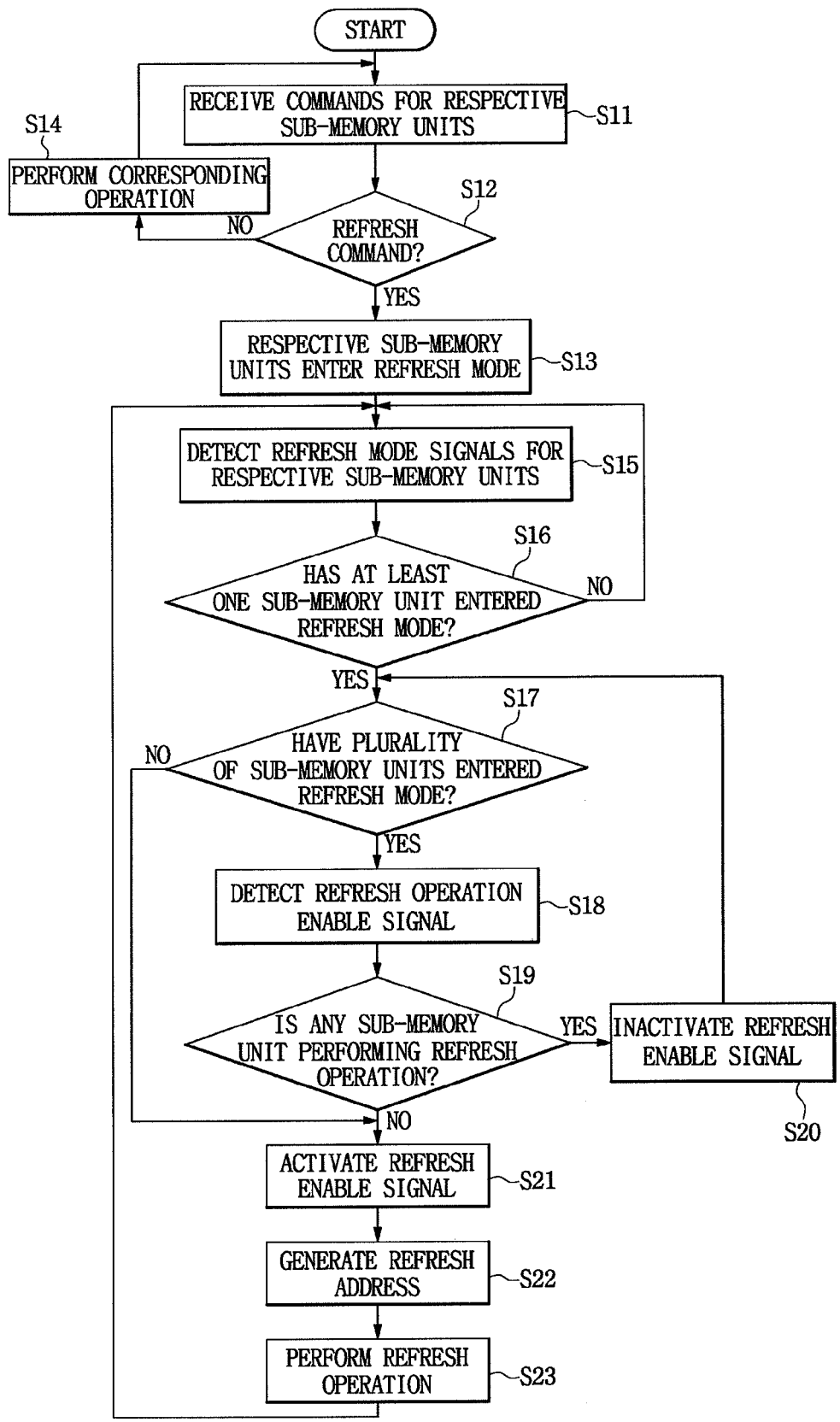

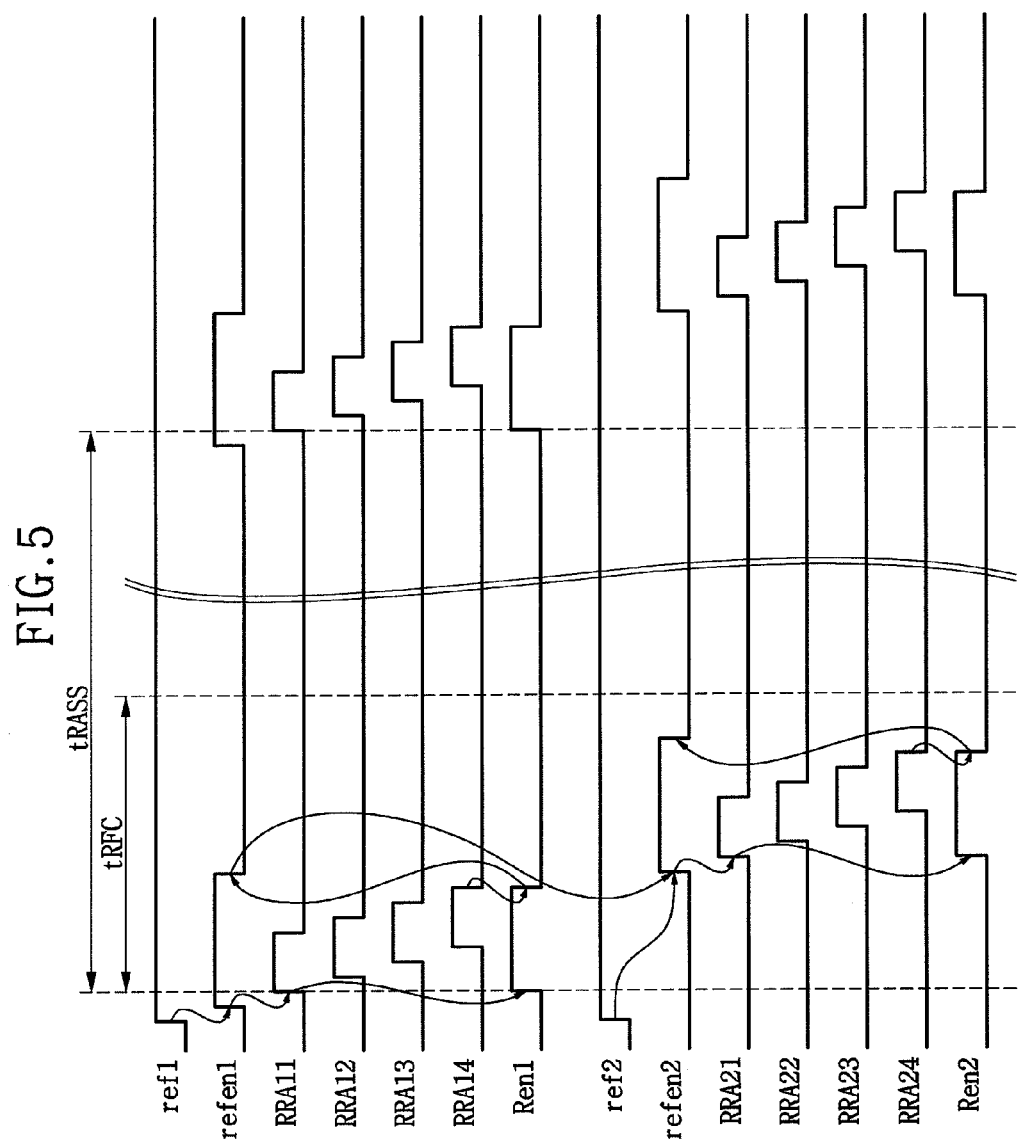

MULTI-CHANNEL SEMICONDUCTOR MEMORY DEVICE AND METHOD OF REFRESHING THE SAME

PRIORITY STATEMENT

This application claims the benefit of priority, under 35 U.S.C. §119, of Korean Patent Application No. 10-2009-0061827, filed on Jul. 7, 2009, the contents of which are hereby incorporated by reference herein in its entirety.

BACKGROUND

1. Field of the Invention

The invention relates to a semiconductor memory device, and a method of refreshing the same, and more particularly, to a multi-channel semiconductor memory device, and a method of refreshing the same.

2. Description of Related Art

The demand by consumers and by industry for high-speed and highly integrated semiconductor memory devices continues to increase, and to meet this demand semiconductor memory devices are continuously being developed in various forms, such as multi-bank semiconductor memory devices and multi-chip semiconductor memory devices. Recently, multi-channel semiconductor memory devices have been proposed to enable high integration as well as to provide high bandwidth operation. A multi-channel semiconductor memory device has a plurality of sub-memory units (e.g., packaged integrated circuits, ICs) in a single chip. Each of the sub-memory units has input/output (I/O) pads and can operate as an individual memory device. Thus, each of the sub-memory units of the multi-channel semiconductor memory device operates as an independent memory device that inputs and outputs addresses, commands and data.

SUMMARY

Aspects of the inventive concept provide a multi-channel semiconductor memory device and a method of refreshing the same. In the multi-channel semiconductor memory device and method, a common refresh controller is prepared to detect refresh operation states of a plurality of sub-memory circuits (e.g. ICs) and to adjust refresh operation times of multiple sub-memory circuits so that two or more sub-memory circuits do not simultaneously perform a refresh operation.

Exemplary embodiments provide a multi-channel semiconductor memory device capable of reducing a refresh peak current.

Exemplary embodiments also provide a method of refreshing the multi-channel semiconductor memory device.

Exemplary embodiments are directed to a multi-channel semiconductor memory device. The multi-channel semiconductor memory device includes: a plurality of sub-memory circuits (e.g., packaged ICs), each including a plurality of memory cells (e.g., arrange in a memory array having word lines and bit lines) and a plurality of dedicated input/output (I/O) pads and configured to independently operate (e.g., having their own row decoders and column decoders); and a common memory controller configured to control the sub-memory circuits so that two or more of the sub-memory circuits do not simultaneously perform a refresh operation.

Each of the sub-memory circuits may include a channel controller configured to output a refresh mode signal to the common memory controller if a refresh command is received, perform the refresh operation in response to a refresh enable signal received from the common memory controller, and activate and output a refresh operation enable signal to a common refresh controller during the refresh operation.

The common memory controller may include the common refresh controller configured to determine whether a sub-memory circuit has the activated refresh operation enable signal if the refresh mode signals are received from two or more of the sub-memory circuits, and inactivate the refresh enable signals for the remaining sub-memory circuits while a sub-memory circuit has the activated refresh operation enable signal.

The channel controller may include: a command decoder configured to decode a command received from the outside, and output the refresh mode signal if the command is a refresh command; and a refresh circuit unit configured to generate a refresh bank address and a refresh row address for performing the refresh operation on at least one bank in response to the refresh mode signal and the refresh enable signal, and output the refresh operation enable signal activated during the activation of the refresh row address.

Each of the sub-memory circuits may further include: a plurality of banks, each including a plurality of memory cells disposed between a plurality of word lines and a plurality of bit lines, and a plurality of sense amplifiers connected to the bit lines and configured to sense and amplify data of the memory cells; a plurality of row decoders configured to activate a word line of a corresponding bank among the banks in response to the row address and the refresh row address; a bank selection unit configured to activate a corresponding row decoder among the row decoders in response to a bank address and the refresh bank address; and a column decoder configured to select sense amplifiers of the corresponding bank.

The common memory controller may further include: a power supply unit configured to supply a power source voltage to the sub-memory circuits; and a test unit configured to test the sub-memory circuits.

Exemplary embodiments are also directed to a method of refreshing a multi-channel semiconductor memory device, the multi-channel semiconductor memory device including a plurality of sub-memory circuit (e.g. ICs) each having a plurality of memory cells and a plurality of dedicated I/O pads and configured to independently operate. The method includes: determining whether two or more of the sub-memory circuits have entered a refresh mode; activating a refresh enable signal for only one of the sub-memory circuits if it is determined that two or more sub-memory circuits have entered the refresh mode; and performing a refresh operation on the sub-memory circuit corresponding to the activated refresh enable signal.

Determining whether two or more sub-memory circuits have entered a refresh mode may include: determining whether commands applied to the respective sub-memory circuits are refresh commands; and activating and outputting refresh mode signals if it is determined that the applied commands are refresh commands.

Activating the refresh enable signal for only one of the sub-memory circuits may include: detecting the refresh mode signals applied to the respective sub-memory circuits; determining whether a sub-memory circuit has an activated refresh operation enable signal if the refresh mode signals for two or more of the sub-memory circuits are activated; and inactivating the refresh enable signals for the remaining sub-memory circuits while it is determined that a sub-memory circuit has an activated refresh operation enable signal, and activating only a single refresh enable signal based on a predetermined method if it is determined that no sub-memory circuit has an activated refresh operation enable signal.

Performing the refresh operation may include: generating a refresh bank address and a refresh row address for performing the refresh operation on a plurality of banks of a sub-memory circuit corresponding to the activated refresh enable signal among the sub-memory circuits, and performing the refresh operation; and outputting the refresh operation enable signal activated during the activation of the refresh row address.

Accordingly, while exemplary embodiments are capable of various modifications and alternative forms, embodiments thereof are shown by way of example in the drawings and will herein be described in detail. It should be understood, however, that there is no intent to limit exemplary embodiments to the particular forms disclosed, but on the contrary, exemplary embodiments are to cover all modifications, equivalents, and alternatives falling within the scope of the inventive concept.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of exemplary embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise.

The regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures.

In order to more specifically describe exemplary embodiments, various aspects will be described in detail with reference to the attached drawings. However, the inventive concept is not limited to exemplary embodiments described.

Various exemplary embodiments will now be described more fully with reference to the accompanying drawings in which some exemplary embodiments are shown.

Detailed illustrative embodiments are disclosed herein. However, specific structural and functional details disclosed herein are merely representative for purposes of describing exemplary embodiments. This inventive concept, however, may be embodied in many alternate forms and should not be construed as limited to only exemplary embodiments set forth herein. Like numbers refer to like elements throughout the description of the figures. It should be understood that various aspects of the drawings may have been exaggerated for clarity

BRIEF DESCRIPTION OF THE DRAWINGS

Exemplary embodiments are described in further detail below with reference to the accompanying drawings, in which:

FIG. 4 is a flowchart illustrating the refresh operation of the multi-channel semiconductor memory device 10 of FIG. 1; and FIG. 5 is a timing diagram illustrating the refresh operation of the multi-channel semiconductor memory device 10 of FIG. 1.

DETAILED DESCRIPTION OF EXEMPLARY EMBODIMENTS OF THE INVENTIVE CONCEPT

A multi-channel semiconductor memory device capable of reducing a refresh peak current is described below with reference to the accompanying drawings.

Figure 1:
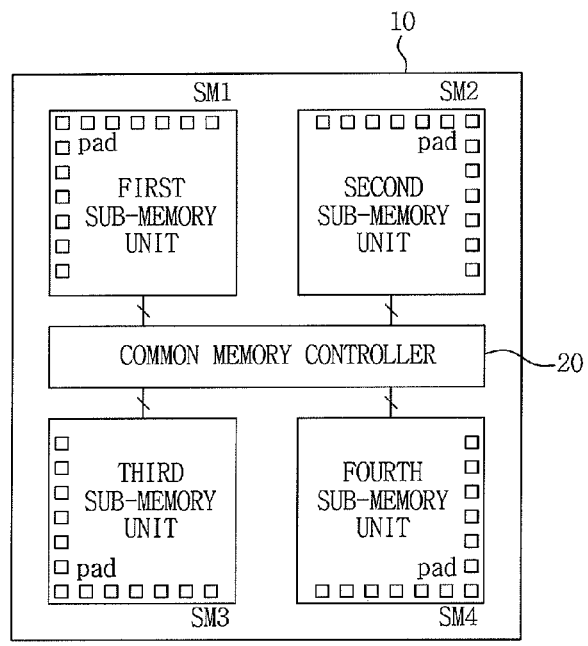
FIG. 1 is a block diagram of a multi-channel semiconductor memory device 10 according to an exemplary embodiment of the inventive concept.

FIG. 1 is a block diagram of a multi-channel semiconductor memory device 10 according to an exemplary embodiment of the inventive concept. In FIG. 1, the multi-channel semiconductor device has four channels.

Referring to FIG. 1, the multi-channel semiconductor memory device 10 includes a plurality of sub-memory units SM1 to SM4 in a single chip. Each of the sub-memory units SM1 to SM4 includes a plurality of dedicated input/output (I/O) pads for inputting and outputting addresses, commands and data. Accordingly, each of the sub-memory units SM1 to SM4 can operate as an independent memory device. Each of the sub-memory units SM1 to SM4 may include a plurality of banks, each of which includes a plurality of memory cells between a plurality of word lines and a plurality of bit lines as in a typical semiconductor memory device. Thus, each of the sub-memory units SM1 to SM4 may be configured as a multi-bank semiconductor memory device.

The multi-channel semiconductor memory device 10 further includes a common memory controller 20. The common memory controller 20 may include a power supply circuit (not shown) for supplying power source voltage used in common for the sub-memory units SM1 to SM4, and a test circuit (not shown) for testing the sub-memory units SM1 to SM4. Also, in exemplary embodiments, the common memory controller 20 includes a common refresh controller 210 (not shown) for controlling the refresh timing of the respective sub-memory units SM1, SM2, SM3 and SM4.

As described above, the multi-channel semiconductor memory device 10 includes the sub-memory units SM1 to SM4, each of which can operate as an independent memory device, and the power supply circuit and the test circuit are used in common for the sub-memory units SM1 to SM4. Accordingly, the degree of integration (miniaturization) of the semiconductor memory device can be increased.

Figure 2:
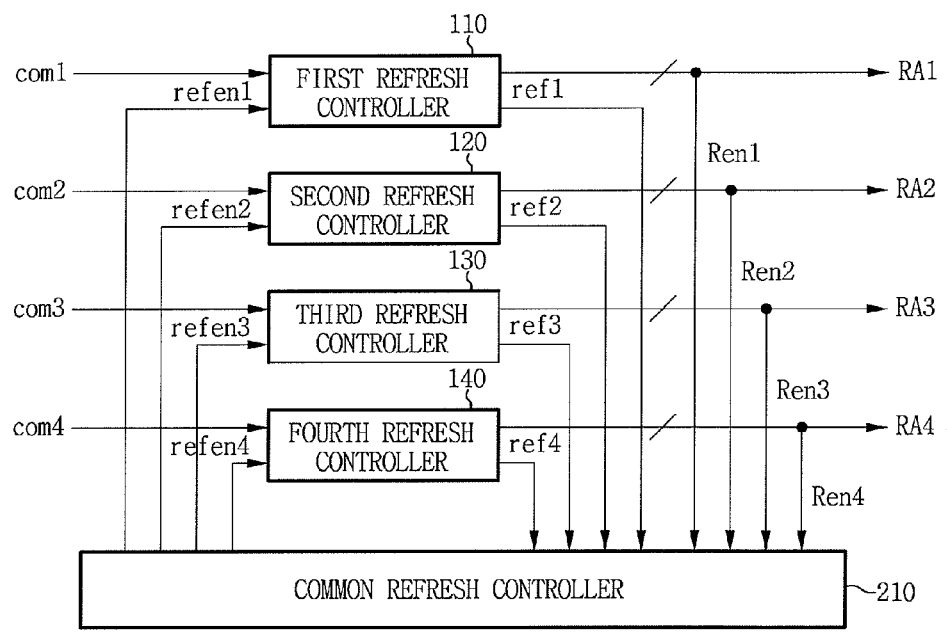
FIG. 2 is a block diagram of the common refresh controller 210 in the multi-channel semiconductor memory device 10 of FIG. 1.

FIG. 2 is a block diagram of the refresh controller 210 in the multi-channel semiconductor memory device 10 shown in FIG. 1.

In FIG. 2, first to fourth refresh controllers 110, 120, 130, 140 are respectively used for the first to fourth sub-memory units SM1 to SM4. The sub-memory units SM1 to SM4 may include the first to fourth refresh controllers 110 to 140, respectively. The sub-memory units SM1 to SM4 separately receive commands, so the first to fourth refresh controllers 110 to 140 can receive respective corresponding commands com1 to com4 through dedicated I/O pads that are provided in the first to fourth sub-memory units SM1 to SM4. The first to fourth refresh controllers 110 to 140 determine whether or not the corresponding first to fourth commands com1 to com4 received are refresh commands such as self-refresh commands or auto-refresh commands. If the received commands com1 to com4 are refresh commands, the first to fourth refresh controllers 110 to 140 respectively activate first to fourth refresh mode signals ref1 to ref4 and output the activated first to fourth refresh mode signals ref1 to ref4, respectively, to the common refresh controller 210.

The common refresh controller 210 receives the first to fourth refresh mode signals ref1 to ref4, and detects whether or not each of the sub-memory units SM1 to SM4 has entered the refresh mode. When only one of the sub-memory units SM1 to SM4 has entered the refresh mode, the common refresh controller 210 activates the corresponding one of refresh enable signals refen1 to refen4 and outputs the activated one of the refresh enable signals refen1 to refen4 to the corresponding one of the refresh controllers 110 to 140. When on of the refresh enable signals refen1 to refen4 is activated, the corresponding activated first to fourth refresh controllers 110 to 140 generate refresh row address signals RRA1 to RRA4 for activating one or more word lines in at least one bank of the sub-memory units SM1 to SM4 that corresponds to the activated refresh enable signal(s), and the corresponding one of the sub-memory units SM1 to SM4 performs a refresh operation. During the refresh operation, the first to fourth refresh controllers 110 to 140 activate refresh operation enable signals Ren1 to Ren4 and output the activated refresh operation enable signals Ren1 to Ren4 to the common refresh controller 210.

A plurality of refresh mode signals among the first to fourth refresh mode signals ref1 to ref4 may be activated at the same time. This indicates that a plurality of sub-memory units have entered the refresh mode at the same time. When a plurality of sub-memory units simultaneously perform the refresh operation, the current simultaneously consumed is greatly increased, and thus the peak current is increased. When the peak current is increased, noise is generated. Thus, the supply voltage of the semiconductor memory device becomes unstable, and the refresh operation cannot be reliably performed. While some of the sub-memory units SM1 to SM4 are performing the refresh operation, the remaining sub-memory units may be perform other normal operations such as read/write operations, and thus the above-mentioned noise may cause the entire system employing the multi-channel semiconductor memory device to malfunction. Accordingly, when the plurality of refresh mode signals ref1 to ref4 are activated, the common refresh controller 210 adjusts the refresh enable signals refen1 to refen4 so as to be activated at different times (e.g., sequentially) and outputs the refresh enable signals refen1 to refen4 (e.g., sequentially) so that the sub-memory units SM1 to SM4 do not simultaneously perform the refresh operation. In order to adjust the activation times of the refresh enable signals refen1 to refen4 to be different from each other, the common refresh controller 210 detects the activation states of the respective refresh operation enable signals Ren1 to Ren4 output from the refresh controllers 110 to 140. When at least one of the refresh operation enable signals Ren1 to Ren4 is activated and output from the refresh controllers 110 to 140, the common refresh controller 210 does not activate (inhibits activation of) the refresh enable signals refen1 to refen4 applied to the remaining refresh controllers. Thus, the refresh operation is not simultaneously performed on a plurality of sub-memory units. For example, while the first to third sub-memory units SM1 to SM3 are in the refresh mode and the first refresh controller 110 activates and outputs the first refresh operation enable signal Ren1, the common refresh controller 210 inactivates (inhibits) the second and third refresh enable signals refen2 and refen3.

Thereafter, while the activated first refresh operation enable signal Ren1 becomes inactivated, the common refresh controller 210 activates the second refresh enable signal refen2 and outputs the activated second refresh enable signal refen2 to the second refresh controller 120. in the activation order of the second and third refresh mode signals ref2 and ref3, and inactivates the first and third refresh enable signals refen1 and refen3. Thus, the common refresh controller 210 activates and outputs only a single refresh enable signal for the sub-memory units SM1 to SM3 in the refresh mode at a time so that only one sub-memory unit can perform the refresh operation at a time in the order of entry into the refresh mode of the sub-memory units SM1 to SM4.

Generally, a refresh period tRASS prescribed by the specifications of the semiconductor memory device is required for activating respective refresh row address signals when a semiconductor memory device performs a refresh operation. A maximum refresh period tRFC in which the refresh row address signals can be activated is also prescribed by the specifications. For example, the refresh period tRASS required for activating the refresh row address signals of the semiconductor memory device may be set to 76 μs, and the maximum refresh period tRFC in which the refresh row addresses can be activated may be set to 90 ns. Thus, the maximum refresh period tRFC in which the refresh row addresses can be activated is a relatively very short period when compared with the refresh period tRASS required for activating the refresh row address signals. In an actual semiconductor memory device, the period required for activating row addresses is generally set to a very short period (for example, 10 ns) when compared with the maximum refresh period tRFC in which refresh row addresses can be activated.

Accordingly, the designated timing specifications can be maintained even when the sub-memory units SM1 to SM4 simultaneously enter the refresh mode if the common refresh controller 210 adjusts (sequentially enables) the refresh operation time of the respective sub-memory units SM1 to SM4.

Although it has been described above that the sequence in which the sub-memory units perform the refresh operation is based on the order of entry into refresh mode of the sub-memory units, the sequence in which the sub-memory units that perform the refresh operation may be determined according to a predetermined order.

Figure 3:
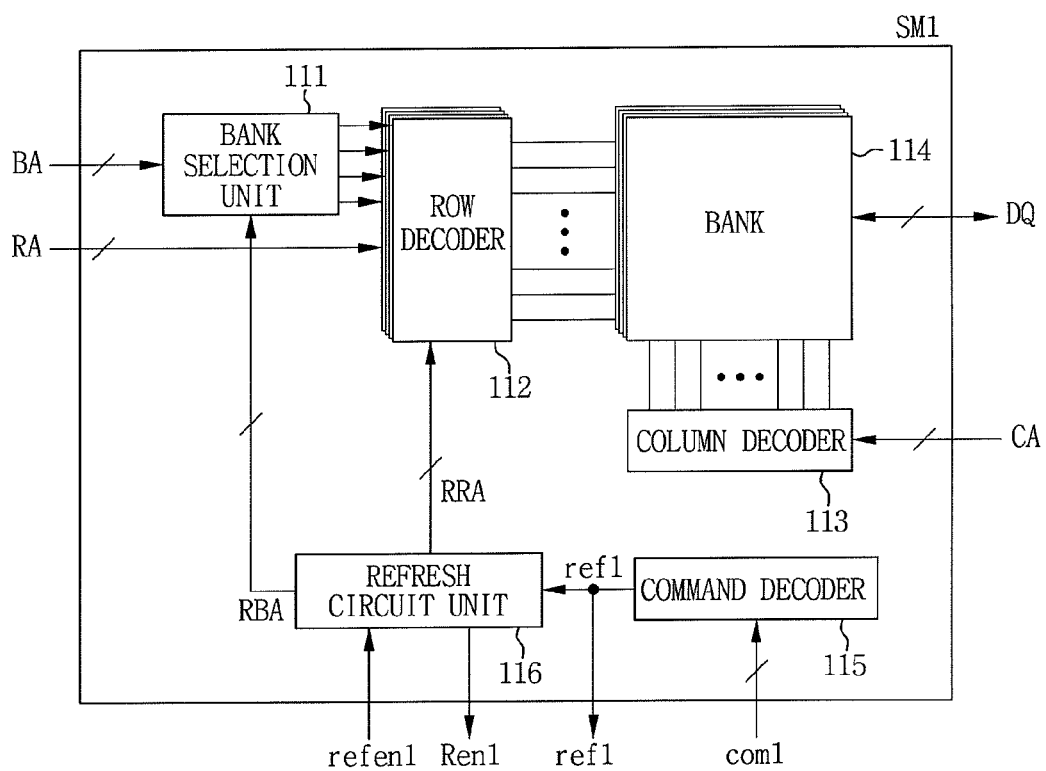
FIG. 3 is a block diagram showing an exemplary implementation of one of the sub-memory units SM1 in FIG. 1.

FIG. 3 is a block diagram showing an exemplary implementation of one of the sub-memory units SM1 in the device 10 of FIG. 1. Only one of the sub-memory units SM1 is shown in FIG. 3, and it is assumed that the sub-memory unit has a multi-bank structure including identical sub-memory units. Referring to FIG. 3, the sub-memory unit SM1 includes a bank selection unit 111, a plurality of row decoders 112, at least one column decoder 113, a plurality of banks 114, a command decoder 115, and a refresh circuit unit 116.

The bank selection unit 111 selects and activates at least one of the plurality of row decoders 112 in response to a bank address BA received from the outside or a refresh bank address RBA received from the refresh circuit unit 116. The activated row decoder 112 among the plurality of row decoders 112 decodes the row address RA or the refresh row address RRA, and activates a word line corresponding to the row address (RA or RRA) among a plurality of word lines of the corresponding one of the banks 114. A plurality of sense amplifiers is connected to the plurality of bit lines. The at least one column decoder 113 decodes a column address CA, and selects a sense amplifier corresponding to the column address CA among the sense amplifiers of each bank. Each of the plurality of banks 114 includes a plurality of memory cells. Each memory cell is connected between one of a plurality of word lines and one of a plurality of bit lines. In a read operation data DQ of memory cells connected between word lines selected by the row decoders 112 and bit lines connected to sense amplifiers selected by the column decoder 113, is output to the outside, and in a write operation data DQ received from the outside is stored in (written into) the memory cells.

A command decoder and a refresh circuit unit are included in each of the refresh controllers 110 to 140 shown in FIG. 2. The command decoder 115 and the refresh circuit unit 116 is included the refresh controller 110 shown in FIG. 2. The command decoder 115 decodes a command com1 received from the outside, and outputs a refresh mode signal ref (ref1) to the refresh circuit unit 116 and to the common refresh controller 210 when the command com (com1) received from the outside is a command for a refresh operation. The refresh circuit unit 116 generates the refresh bank address RBA and the refresh row address RRA in response to the refresh mode signal ref (ref1) and a refresh enable signal refen (refen1), and outputs the generated refresh bank address RBA and refresh row address RRA to the bank selection unit 111 and the row decoders 112, respectively. Also, the refresh circuit unit 116 generates a refresh operation enable signal Ren (Ren1) and outputs the generated refresh operation enable signal Ren (Ren1) to the common refresh controller 210. When the refresh enable signal refen (refen1) is in an inactivated state, the refresh circuit unit 116 does not generate either the refresh bank address RBA or the refresh row address RRA even if the refresh circuit unit 116 enters the refresh mode by receiving the refresh mode signal ref (ref1) from the command decoder 115. The refresh operation enable signal Ren (Ren1) is activated during the activation of the refresh row address RRA, and thus also maintains an inactivation state. Thus, the inactivated refresh enable signal refen (refen1) means that the refresh operation is being performed in a different sub-memory unit. In this case, the refresh circuit unit 116 does not output any of the refresh bank address RBA, the refresh row address RRA, and the refresh operation enable signal Ren to prevent the sub-memory units from simultaneously performing the refresh operation.

The bank selection unit 111 activates at least one of the row decoders 112 to select a wordline in a corresponding bank 114 in response to the refresh bank address RBA. When the activated row decoder 112 decodes the refresh row address RRA and activates a word line corresponding to the refresh row address RRA among a plurality of word lines of the corresponding bank 114, a sense amplifier of the corresponding bank 114 amplifies data of the corresponding word line sensed through corresponding bit lines. The amplified data is written back to (stored in) memory cells connected to the activated word lines. In this manner, the refresh operation is performed.

Although not shown in the drawings, the sub-memory unit may additionally include a data I/O unit for receiving data DQ from the outside during a write operation and outputting data DQ to the outside during a read operation. Although the refresh enable signal refen (refen1) received from the common refresh controller 210 has been shown as being received separately from the addresses BA, RA and CA or the command corn (com1), the refresh enable signal refen (refen1) may be included in the command corn and received along with the command corn. The refresh mode signal ref (ref1) and the refresh row address RRA may also be output to the common refresh controller 210 through the data I/O unit.

Although it has been described above that each of the sub-memory units has a multi-bank structure, in alternative embodiments, each of the sub-memory units may include only a single memory cell array.

FIG. 4 is a flowchart illustrating the sequential refresh operation of the multi-channel semiconductor memory device according to exemplary embodiments.

The method of operation of the multi-channel semiconductor memory device illustrated in FIG. 4 is described below with reference to FIGS. 1 to 3. First, the respective sub-memory units SM1 to SM4 receive commands com1 to com4 from the outside (step S11). In decision step S12 the command decoders 115 of the respective sub-memory units SM1 to SM4 receiving the commands com1 to com4 determine whether the commands com1 to com4 are refresh commands, such as a self-refresh command and auto-refresh commands, by decoding the commands com1 to com4. If it is determined that the received commands are refresh commands (YES branch of S12), the refresh mode signals ref1 to ref4 are output to the respective refresh circuit units 116 of the sub-memory units and the common refresh controller 210, and the sub-memory units in which the refresh mode signals ref1 to ref4 are activated enter the refresh mode (S13). In contrast, when it is determined that the commands com1 to com4 received in operation S12 are not the refresh commands (NO branch of S12), operations corresponding to the received commands are performed (S14), and then the next commands are received (S11).

In step S15, the common refresh controller 210 detects the refresh mode signals ref1 to ref4 received from the respective sub-memory units SM1 to SM4, checks whether or not the respective sub-memory units SM1 to SM4 have entered the refresh mode, and stores their order of entry into the refresh mode of the sub-memory units SM1 to SM4 as needed. It is decided whether or not at least one of the sub-memory units has entered the refresh mode in decision step S16. If it is determined that at least one sub-memory unit has entered the refresh mode (YES branch of S16), it is checked whether a plurality of sub-memory units have entered the refresh mode in decision step S17. If it is determined in decision step S16 that none of the sub-memory units SM1 to SM4 has entered the refresh mode (NO branch of S16), then the common refresh controller 210 keeps detecting the refresh mode signals ref1 to ref4 (step S15).

If it is detected in decision step S17 that a plurality of sub-memory units (for example, the first to third sub-memory units SM1 to SM3) have entered the refresh mode (YES branch of S17), then in decision step S18 the common refresh controller 210 detects that a sub-memory unit has an activated refresh operation enable signal among the sub-memory units SM1 to SM3 in the refresh mode. In decision step S19, the common refresh controller 210 determines whether any sub-memory unit is performing the refresh operation based on the activation of refresh operation enable signals Ren1 to Ren3. If it is determined in decision step S19 that a sub-memory unit (for example, the first sub-memory unit SM1) is performing the refresh operation, (i.e., it is determined that the first refresh operation enable signal Ren1 has been activated), then in inactivation step S20 the refresh enable signals refen2 and refen3 for the remaining sub-memory units SM2 and SM3 are not activated (inhibited). Then decision step S17 is performed again and it is checked whether a plurality of sub-memory units have entered the refresh mode.

In contrast, if it is determined in decision step 19 that no sub-memory unit is performing the refresh operation, a refresh enable signal (for example, the second refresh enable signal refen2) for one of the sub-memory units SM1 to SM3 placed in the refresh mode is activated based on a predetermined order or based on the order of entry into refresh mode of the sub-memory units that was stored in step 15. If it is determined in decision step S17 that only a single sub-memory unit (for example, the second sub-memory unit SM2) has entered the refresh mode (NO branch of S17), the one (e.g., the second) refresh enable signal refen2 is activated in the same manner in step S21.

When the second refresh enable signal refen2 is activated (S21), in step S22 the refresh circuit unit 116 of the second sub-memory unit SM2 generates a refresh bank address RBA and a refresh row address RRA2 in response to a refresh mode signal ref2 and the second refresh enable signal refen2, outputs the generated refresh bank address RBA and the generated refresh row address RRA2 to the bank selection unit 111 and the row decoder 112, activates the second refresh operation enable signal Ren2, and outputs the activated second refresh operation enable signal Ren2 to the common refresh controller 210. Subsequently, in step S23 the bank selection unit 111 and the row decoder 112 activate the corresponding word line of the banks 114 in response to the refresh bank address RBA and the refresh row address RRA2 and refresh a specific row of memory cells. Thereafter, when the refresh operation is completed and the refresh row address RRA2 is inactivated, the second refresh operation enable signal Ren2 is also inactivated, decision step S15 is again performed and the common refresh controller 210 checks whether the respective sub-memory units SM1 to SM4 have entered the refresh mode.

FIG. 5 is a timing diagram illustrating the method of operation of the multi-channel semiconductor memory device of FIG. 1. For convenience, only two channels are illustrated, and it is assumed that the first and second sub-memory units SM1 and SM2 simultaneously receive respective refresh commands. The curved lines with arrows indicate causal connections between connected transition events.

The timing diagram of FIG. 5 is described below with reference to FIGS. 1 to 4. First, since the command decoders 115 of the first and second sub-memory units SM1 and SM2 receive respective refresh commands from the outside, the command decoders 115 activate first and second refresh mode signals ref1 and ref2 and output the activated first and second refresh mode signals ref1 and ref2 to the respective refresh circuit units 116 as well as the common refresh controller 210. The common refresh controller 210 receives the activated refresh mode signals ref1 and ref2, activates a first refresh enable signal refen1 while inactivating a second refresh enable signal refen2 in a predetermined order, and outputs the activated first refresh enable signal refen1 to the refresh circuit unit 116 of the first sub-memory unit SM1 and the inactivated second refresh enable signal refen2 to the refresh circuit unit 116 of the second sub-memory unit SM2. The refresh circuit unit 116 of the first sub-memory unit SM1 generates and outputs a refresh bank address RBA and a refresh row address RRA in response to both the activated first refresh mode signal ref1 and the activated first refresh enable signal refen1.

When each of the sub-memory units has a multi-bank structure, word lines of the respective banks 114 may be simultaneously activated. However, when the word lines of the banks 114 are simultaneously activated, the peak current increases as in the case where a plurality of sub-memory units simultaneously perform the refresh operation. Accordingly, the word lines of the banks 114 may be sequentially activated. A method of sequentially activating word lines of a plurality of banks during a refresh operation is a well-known technique, and thus detailed description thereof is omitted herein. In FIG. 5, it is assumed that the respective refresh circuit units 116 sequentially activate the word lines of the banks 114. Four refresh word lines RRA11 to RRA14 of the first sub-memory unit SM1 shown in FIG. 5 represent word lines of different banks, respectively. Likewise, four refresh word lines RRA21, RRA22, RRA23 and RRA24 of the second sub-memory unit SM2 shown in FIG. 5 also represent word lines of different banks, respectively.

Although FIG. 5 shows that the refresh word lines RRA11 to RRA14 and RRA21 to RRA24 for respective banks are activated to overlap each other at a predetermined interval, the refresh word lines RRA11 to RRA14 and RRA21 to RRA24 may be activated without overlapping each other.

The first refresh operation enable signal Ren1 is activated during the same period as the refresh operation period in which the refresh row addresses RRA11 to RRA14 are activated, and is output to the common refresh controller 210. When the first refresh operation enable signal Ren1 is in an activation state, the common refresh controller 210 maintains the refresh enable signal refen2 for the remaining sub-memory unit SM2 in an inactive state.

Thereafter, when the refresh operation for the first sub-memory unit SM1 is completed and the first refresh operation enable signal Ren1 is inactivated, and then the common refresh controller 210 activates the second refresh enable signal refen2. The refresh circuit unit 116 of the second sub-memory unit SM2 generates and outputs a refresh bank address RBA and refresh row addresses RRA21 to RRA24 in response to both the second refresh enable signal refen2 and the refresh mode signal ref2.

As shown in FIG. 5, the refresh row addresses RRA11 to RRA14 and RRA21 to RRA24 of the first and second sub-memory units SM1 and SM2 can be activated within the maximum period tRFC specified in the prescribed specifications, in which refresh row addresses can be activated, even when the two sub-memory units enter the refresh mode simultaneously. Also, the period tRASS in which refresh row address signals are activated may also be based on the rules of the prescribed specifications.

Although FIG. 5 shows that all of the refresh row addresses RRA11 to RRA14 and RRA21 to RRA24 are activated to refresh all the banks of the sub-memory units SM1 and SM2 by one refresh operation, only a single word line (for example, RRA11) in each one bank may be activated in one refresh operation. In this case, the multi-channel semiconductor memory device of FIG. 5 may perform the refresh operation in the order of the first bank refresh row address RRA11 of the first sub-memory unit, the first bank refresh row address RRA21 of the second sub-memory unit, and the second bank refresh row address RRA12 of the first sub-memory unit. Thus, the refresh operation may be alternately performed on the sub-memory units and the banks.

Although, in FIG. 5, the descriptions of the refresh operation have been made based on a self-refresh operation, the multi-channel semiconductor memory device may operate in a similar manner even when an auto-refresh operation is performed.

Accordingly, a multi-channel semiconductor memory device and a method of refreshing the multi-channel semiconductor memory device according to exemplary embodiments adjust (e.g., sequentially enable/inhibit) refresh operation timing so that a plurality of sub-memory units do not simultaneously perform the refresh operation, thus reducing the peak current.

The foregoing is illustrative of exemplary embodiments and is not to be construed as limiting thereof. Although a few exemplary embodiments have been described, those skilled in the art will readily appreciate that many modifications are possible in exemplary embodiments without materially departing from the novel teachings and advantages. Accordingly, all such modifications are intended to be included within the scope of this inventive concept as defined in the claims. Therefore, it is to be understood that the foregoing is illustrative of various exemplary embodiments and is not to be construed as limited to the specific embodiments disclosed, and that modifications to the disclosed embodiments, as well as other embodiments, are intended to be included within the scope of the appended claims.

What is claimed is:

1. A multi-channel semiconductor memory device, comprising:
   a plurality of sub-memory circuits, each sub-memory circuit having a memory cell array, a row decoder and a column decoder; and
   a common memory controller configured to control the sub-memory circuits so that two or more of the sub-memory circuits do not simultaneously perform a refresh operation,
   wherein each of the sub-memory circuits comprise a refresh controller configured to output a refresh mode signal to the common memory controller if a refresh command is received, to perform the refresh operation in response to a refresh enable signal received from the common memory controller, and to activate and output a refresh operation enable signal during the refresh operation,
   wherein the common memory controller comprises a common refresh controller configured to determine whether a sub-memory circuit has the activated refresh operation enable signal if the refresh mode signals are received from two or more of the sub-memory circuits, and to inactivate the refresh enable signals for the remaining sub-memory circuits while a sub-memory circuit has the activated refresh operation enable signal.

2. The multi-channel semiconductor memory device according to claim 1, wherein the refresh controller comprises:
   a command decoder configured to decode a command received from an outside, and output the refresh mode signal when the command is the refresh command; and
   a refresh circuit unit configured to generate a refresh bank address and a refresh row address for performing the refresh operation on at least one bank in response to the refresh mode signal and the refresh enable signal, and output the refresh operation enable signal activated during activation of the refresh row address.

3. The multi-channel semiconductor memory device according to claim 2, wherein each of the sub-memory circuits further comprises:
   a plurality of banks, each comprising a plurality of memory cells disposed between a plurality of word lines and a plurality of bit lines, and a plurality of sense amplifiers connected to the bit lines and configured to sense and amplify data of the memory cells;
   a plurality of row decoders configured to activate a word line of a corresponding bank among the banks in response to the row address and the refresh row address;
   a bank selection unit configured to activate a corresponding row decoder among the row decoders in response to a bank address and the refresh bank address; and
   a column decoder configured to select sense amplifiers of the corresponding bank.

4. The multi-channel semiconductor memory device according to claim 2,
   each of the sub-memory circuits is a packaged integrated circuit (IC) that includes a plurality of dedicated input/output (I/O) pads, and wherein the common memory controller further comprises:
   a power supply unit configured to supply a power source voltage to the sub-memory circuits; and
   a test unit configured to test the sub-memory circuits.

5. A semiconductor memory device, comprising:
   a plurality of sub-memory circuits, each sub-memory circuit having a memory cell array including plurality of memory cells, a row decoder and a column decoder; and
   a common memory controller configured to control the sub-memory circuits so that two or more of the sub-memory circuits do not simultaneously perform a first operation,
   wherein each of the sub-memory circuits comprise an operation controller configured to output a first mode signal to the common memory controller if a first command is received, to perform the first operation in response to a first enable signal received from the common memory controller, and to activate and output a first operation enable signal during performing the first operation,
   wherein the operation controller of each sub-memory circuit is a refresh controller and the first operation is a refresh operation,
   wherein the common memory controller comprises a common refresh controller configured to determine whether a sub-memory circuit has the activated operation enable signal if the first mode signals are received from two or more of the sub-memory circuits, and to inactivate the first enable signals for the remaining sub-memory circuits while a sub-memory circuit has the activated first operation enable signal.

6. The semiconductor memory device according to claim 5, wherein the refresh controller comprises:
   a command decoder configured to decode a command received from an outside, and output the first mode signal when the command is a refresh command; and
   a refresh circuit unit configured to generate a refresh bank address and a refresh row address for performing the refresh operation on at least one bank in response to the first mode signal and the first enable signal, and output the first operation enable signal activated during activation of the refresh row address.

7. The semiconductor memory device according to claim 6, wherein each of the sub-memory circuits further comprises:
   a plurality of banks, each comprising a plurality of memory cells disposed between a plurality of word lines and a plurality of bit lines, and a plurality of sense amplifiers connected to the bit lines and configured to sense and amplify data of the memory cells;
   a plurality of row decoders configured to activate a word line of a corresponding bank among the banks in response to the row address and the refresh row address;
   a bank selection unit configured to activate a corresponding row decoder among the row decoders in response to a bank address and the refresh bank address; and
   a column decoder configured to select sense amplifiers of the corresponding bank.

8. The semiconductor memory device according to claim 6, each of the sub-memory circuits is a packaged integrated circuit (IC) that includes a plurality of dedicated input/ output (I/O) pads, and wherein the common memory controller further comprises:
a power supply unit configured to supply a power source voltage to the sub-memory circuits; and
a test unit configured to test the sub-memory circuits.

9. A method of refreshing a multi-channel semiconductor memory device including a plurality of sub-memory circuits, each having a memory cell array including a plurality of memory cells and a row decoder and a column decoder, and a common memory controller configured to control the sub-memory circuits, the method comprising:
determining whether two or more of the sub-memory circuits have entered a refresh mode;
if it is determined that two or more sub-memory circuits have entered the refresh mode,
then activating a refresh enable signal for only one of the sub-memory circuits; and
performing a refresh operation on the sub-memory circuit corresponding to the activated refresh enable signal,
wherein each of the plurality of sub-memory circuits is a packaged integrated circuit that includes a plurality of dedicated input/output (I/O) pads, wherein determining whether two or more sub-memory circuits have entered a refresh rode comprises:
determining whether commands applied to the respective sub-memory circuits are refresh commands; and
if it is determined that the applied commands are refresh commands, then activating and outputting refresh mode signals,
wherein activating the refresh enable signal for only one of the sub-memory circuits comprises:
detecting the refresh mode signals applied from the respective sub-memory circuits;
if the refresh mode signals for two or more of the sub-memory ICs are activated then determining whether a sub-memory circuit has an activated refresh operation enable signal; and
if it is determined that a sub-memory IC has the activated refresh operation enable signal,
then inactivating the refresh enable signals for the remaining sub-memory circuits, and
activating only a single refresh enable, signal based on a predetermined order while it is determined that no sub-memory circuit has the activated refresh operation enable signal.

10. The method according to claim 9, wherein performing the refresh operation comprises:
generating a refresh bank address and a refresh row address for performing the refresh operation on a plurality of banks of a sub-memory circuit corresponding to the activated refresh enable signal among the sub-memory circuits, and performing the refresh operation; and
outputting the refresh operation enable signal activated during activation of the refresh row address.

* * * * *